(12) United States Patent
Delos et al.

(10) Patent No.: US 9,531,356 B1
(45) Date of Patent: Dec. 27, 2016

(54) INTEGRATED CIRCUIT WITH LOW PHASE NOISE CLOCK DISTRIBUTION NETWORK

(71) Applicant: Lockheed Martin Corporation, Bethesda, MD (US)

(72) Inventors: Peter L. Delos, Mount Laurel, NJ (US); Brandon R. Davis, Mount Laurel, NJ (US); Steven M. Fireman, Wallingford, PA (US)

(73) Assignee: Lockheed Martin Corporation, Bethesda, MD (US)

( * ) Notice: Subject to any disclaimer, the term of this patent is extended or adjusted under 35 U.S.C. 154(b) by 19 days.

(21) Appl. No.: 14/512,917

(22) Filed: Oct. 13, 2014

(51) Int. Cl.
*H03K 21/00* (2006.01)
*H03K 5/00* (2006.01)
*H03K 5/13* (2014.01)

(52) U.S. Cl.
CPC ............ *H03K 5/00006* (2013.01); *H03K 5/13* (2013.01)

(58) Field of Classification Search
CPC .................................................. H03K 5/00006
See application file for complete search history.

(56) References Cited

U.S. PATENT DOCUMENTS

2006/0012408 A1* 1/2006 Kushner .......... H03K 3/356113
327/112

OTHER PUBLICATIONS

Godet, et al., "A Low Phase Noise and Wide Bandwidth BiCMOS SiGe:C 0.25m Digital Frequency Divider for an On-Chip Phase-Noise Measurement Circuit", 9th Topical Meeting on Silicon Monolithic Integrated Circuits in RF Systems (SIRF 2009), Jan. 2009, San Diego, United States, p. 4, 2009.

Horst, S.; Phillips, S.; Lavasani, H.; Ayazi, F.; Cressler, J.D., "SiGe digital frequency dividers with reduced residual phase noise," Custom Integrated Circuits Conference, 2009. CICC '09. IEEE , vol., No., pp. 251,254, Sep. 13-16, 2009.

* cited by examiner

*Primary Examiner* — Daniel Puentes
(74) *Attorney, Agent, or Firm* — Howard IP Law Group, P.C.

(57) ABSTRACT

An integrated circuit includes a clock distribution circuit and a logic block circuit. The clock distribution circuit is segregated from the logic block circuit to restrict contributors to phase noise to the clock distribution section of the circuit. The clock distribution circuit includes a front-end amplifier which buffers a clock input signal to a differential clock signal. The front-end amplifier is configured with as few components as possible and the components are selected for high current density and sized to minimize contributions to phase noise in the clock distribution circuit. The clock distribution circuit further includes an output latch circuit that receives the output signal of the logic block circuit and the low phase noise differential clock input signal from the front-end amplifier circuit. The output latch circuit re-clocks the final output of the integrated circuit. The output is representative of the output values determined by the logic block circuit.

20 Claims, 8 Drawing Sheets

INTEGRATED CIRCUIT WITH LOW PHASE NOISE CLOCK DISTRIBUTION NETWORK

GOVERNMENTAL INTEREST

This invention was made with government support under Government Contract No. N00014-12-C-0224 awarded by the Department of the Navy. The government has certain rights in the invention.

FIELD OF THE INVENTION

This disclosure relates to integrated circuits. More particularly, the disclosure relates to clock distribution networks implemented in integrated circuits.

BACKGROUND OF THE INVENTION

In digital circuits, phase noise occurs due to errors in the clock edges of the digital circuit. Phase noise in a circuit may arise from various sources. For example, fluctuations in current and temperature affect the properties of charge carriers in the conductors of the circuit and introduce random noise. Phase noise also appears as additional frequency components due to short term fluctuations that show up as side bands to the desired signal frequency.

In digital circuits that are clocked using flip flops, the output noise of the circuit is determined by clock noise. When using flip flops, the output of the flip flop does not change until the next edge of the input clock signal. The clock is the mechanism that causes the flip flop to change states. Since phase noise is a measure of the variation in zero crossings of a signal, any noise present in the clock may be seen at the circuit output.

Alternative systems and methods for reducing phase noise in integrated circuits are desired.

SUMMARY

An integrated circuit includes a clock distribution circuit and a logic block circuit. The clock distribution circuit is segregated from the logic block circuit to restrict contributors to phase noise to the clock distribution section of the circuit. The clock distribution circuit includes a front-end amplifier which receives a single ended or differential input clock signal and converts a single ended clock input signal to a differential clock signal. The front-end amplifier is configured with as few components as possible and the components are selected for high current density and sized to minimize contributions to phase noise in the clock distribution circuit. The clock distribution circuit further includes an output latch circuit configured as a D flip flop circuit. The output latch circuit receives the output signal of the logic block circuit and the low phase noise differential clock input signal from the front-end amplifier circuit. The output latch circuit is comprised of components that are selected for minimizing contributions to phase noise in the clock circuit and re-clocks the final output of the integrated circuit. The output is representative of the output values determined by the logic block circuit. The output latch circuit is configured to provide a wide output swing and to operate across a wide operating frequency band. The output latch circuit uses emitter followers to provide feedback to the base electrodes of storage transistors which are biased using the output values of the output latch flip flop circuit.

A method for generating a low phase noise output signal of an integrated circuit includes receiving an input clock signal at a front-end amplifier circuit. The front-end circuit buffers the input clock signal to a differential input clock signal and provides the differential clock signal to the logic block circuit and to an output latch circuit implemented as a D flip flop circuit. The output latch circuit is configured to provide a wide output swing and operated over a wide operating frequency band. The logic block circuit processes the clock signal and an input signal to produce a logic output signal. The logic output signal is provided to the output latch circuit along with the differential clock signal to re-clock the logic output signal with the low phase noise differential clock signal to produce a circuit output signal having low phase noise.

DETAILED DESCRIPTION

Figure 1:
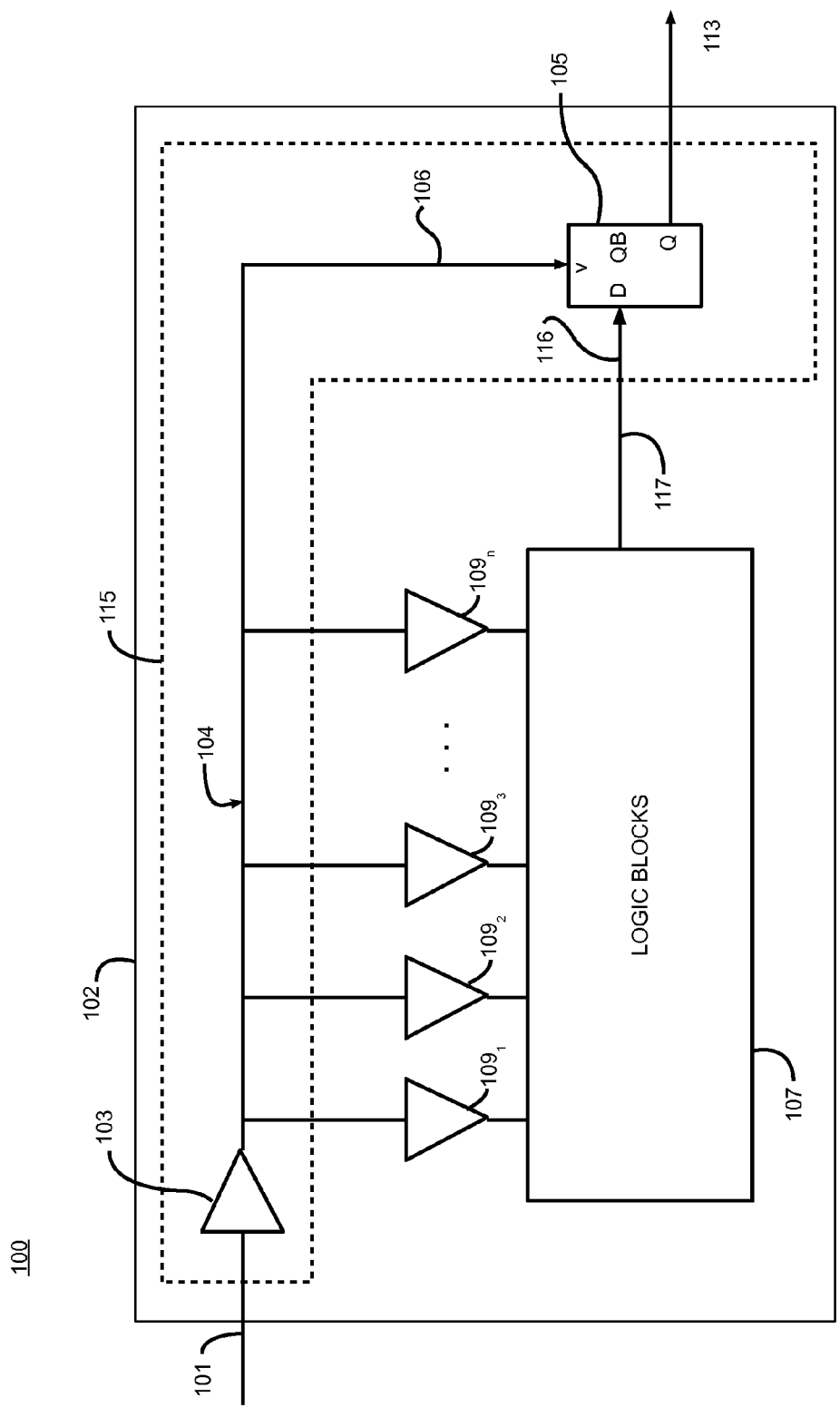
FIG. 1 is a schematic block diagram of an integrated circuit using a segregated clock distribution network according to an embodiment of the disclosure.

FIG. 1 is a high level block diagram of an integrated circuit 100 formed on a single substrate 102 including a low phase noise clock distribution circuit 115 segregated or isolated from other circuit components according to an embodiment of the disclosure. By way of non-limiting example, integrated circuit 100 may be implemented as a radio frequency integrated circuit (RFIC). Integrated circuit 100 includes a clock distribution circuit 115 that provides a clock signal to logic block circuits 107 and provides clocking of the output signal of the integrated circuit 100. The circuit components of clock distribution circuit 115 are carefully selected for low phase noise. The clock distribution circuit 115 is segregated from the logic block circuits 107 such that contributors to phase noise are isolated in the clock distribution circuit 115. Logic block circuits 107 are segregated from the clock distribution circuit such that phase noise generated in the logic block circuits 107 does not contribute to phase noise in the circuit output 113. Because the logic block circuits 107 do not contribute to phase noise in the output 113, logic block components can be implemented for low power, high speed, and miniaturization as primary considerations without a resulting trade-off in phase noise performance. Referring to FIG. 1, the circuit is segregated into two regions. The first region defines clock distribution circuit 115 that includes clocking components of the integrated circuit 100 that contribute to phase noise. The second region is embodied as logic block circuits 107 which, do not contribute to phase noise in the output signal 113. The clock distribution circuit 115 that provides clocking of the output signal 113 is segregated from the logic block circuits 107. The clock distribution circuit 115 and its associated circuit components are selected for low phase noise. Moreover, the clock distribution circuit 115 is configured to have as few components as possible while operating at required output power levels. The components in the low phase noise clock distribution circuit 115 are selected to process an input clock signal 101 and minimize the introduction of additional phase noise. For example, components in clock distribution circuit 115 are selectively sized to reduce phase noise. The low phase noise clock signal 106 is passed through the clock distribution circuit 115 via the final output latch 105 which also receives the output 117 of the logic blocks 107 as a data input. The output 117 of the logic blocks 107 is re-clocked using the low phase noise clock signal 106 of clock distribution circuit 115 to produce output signal 113 having low phase noise. In this manner, the logic block circuits 107 do not contribute to phase noise in the output signal 113. The logic block circuits 107 may include logic implemented with low power, miniaturization and high speed without a trade off in phase noise performance.

When a signal is clocked by a latch such as a flip flop, output phase noise is determined by noise introduced in the clock signal. This occurs because when the input signal changes, the output of the flip flop does not change until the next edge of the clock. Phase noise is the measurement of a variation in zero-crossings of the signal. Since the clock is the mechanism which causes the flip flop to change state, noise in the clock is seen directly in the flip flop output. The architecture of integrated circuit 100 of FIG. 1 leverages this principle to provide a circuit which isolates phase noise within the clock distribution circuit 115. Segregating the clock signal circuits 115 from other parts of the integrated circuit permits the isolation of the contributors to phase noise. The clock distribution circuit 115 is implemented using low phase noise techniques that require more power and careful design. Other circuitry in the architecture of integrated circuit 100 that does not contribute to phase noise in the output is configured without regard to phase noise and may be implemented using lower power logic.

The components that contribute to phase noise (e.g. clock distribution circuit 115) include components that receive and process the input clock signal 101. Front-end amplifier 103 of integrated circuit 100 is configured to buffer input clock signal 101. The front-end amplifier 103 provides the clock signal to a clock distribution path labeled as 104. The clock distribution path 104 simultaneously provides a clock signal to logic blocks 107 via a plurality of clock buffers $109_1$-$109_n$. Clock buffers $109_1$-$109_n$ may be implemented as emitter followers and provide clock signals for the logic block circuit 107. Configuring buffers 109 as emitter followers produces a high input impedance that does not load down the main signal path of the clock distribution circuit 115, as well as a low output impedance that allows each buffer $109_1$-$109_n$ the ability to drive several logic blocks. Front-end amplifier 103 also provides the clock signal to output latch 105. Output latch 105 is implemented as a D flip flop circuit which receives its clock input as low phase noise clock signal 106 from front-end amplifier 103 and its data input 116 from the output 117 of logic block circuitry 107. The front-end amplifier 103, clock distribution path 104 and output latch 105 are configured using the fewest internal components possible. The components making up front-end amplifier 103, clock distribution path 104 and output latch 105 are carefully selected and sized such that additional phase noise added to the input clock signal 101 is minimized. By carefully selecting the components within the low phase noise region defined by clock distribution circuit 115, and by clocking the output signal using output latch 105, any phase noise in the output from logic block circuits 107 can be corrected in the final output signal 113.

The architecture of integrated circuit 100 shown in FIG. 1 is implemented with low phase noise as a primary performance metric. The architecture of integrated circuit 100 is based on the concept of segregating or isolating the contributors to phase noise and restricting them from the circuit output 113. The implementation of the clock distribution stage is optimized for low phase noise. For example, the components of front-end amplifier 103 are selected for low 1/f noise and have bias filters to remove 1/f contributions from bias circuitry. 1/f noise from biasing and devices within the amplifier 103 itself contribute to phase noise. The 1/f noise generated is mixed with the fundamental signal adding to overall phase noise in output 113. 1/f noise may be created by shot noise in the case of hetero-bipolar transistor (HBT) devices and by flicker noise in field effect transistor (FET) devices and some types of poly resistors. Thermal noise may also contribute to phase noise but generally to a lesser extent than 1/f noise, which is generally a much larger contributor to phase noise. Since phase noise is measured in relation to the carrier/fundamental signal, a large signal swing provides lower phase noise. Accordingly, the front end amplifier 103 maintains a large signal swing in order to maintain a large signal to noise ratio. The output latch 105 is optimized similarly to the front-end amplifier 103 for low phase noise. Other areas of the integrated circuit 100 chip such as logic block circuit 107 do not require the low phase noise considerations associated with the clock distribution circuit 115 and are instead optimized for miniaturization, high speed operations, and/or low power. This is because as long as the logic components do not directly control the clocking of the final output signal, no part of the logic block circuit 107 contributes to phase noise in the final output signal 113. In the integrated circuit 100, the clock distribution circuit 115 and low phase noise clock signal 106 update the final update signal via the clock input to output latch 105. It is advantageous to operate logic block circuits 107 synchronously. When operating asynchronously, the output of logic block circuits 107 may control the updating of output signal 113. As the logic block circuits 107 are not specifically configured for low phase noise, allowing the logic block to update the output signal 113 may result in significant degradation in phase noise.

Figure 2:
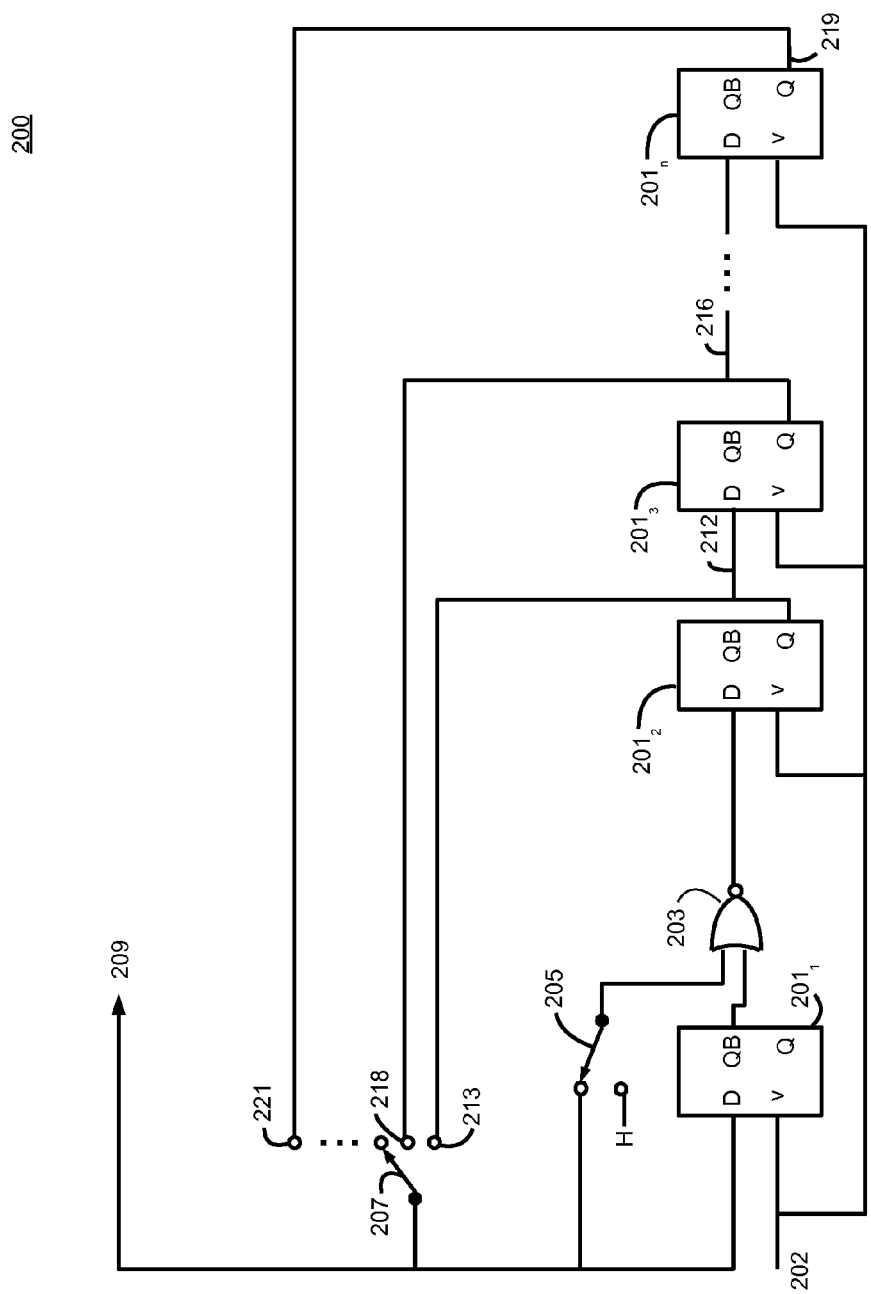
FIG. 2 is a schematic diagram of an embodiment of a logic block section of the integrated circuit of FIG. 1 according to an embodiment of the disclosure.

FIG. 2 is a schematic block diagram showing logic block circuitry 107 of FIG. 1 according to an exemplary embodiment of the disclosure. Logic block circuitry 107 receives a low phase noise clock signal from buffers 109 and process logic operations to generate output data representative of the logic operations performed. In the illustrated embodiment, logic block circuitry may be configured to provide a frequency divider circuit 200. The frequency divider shown in FIG. 2 may be substituted in the architecture of FIG. 1 as logic blocks 107. While the frequency divider implementation is illustrated for the purposes of describing the architecture of FIG. 1, those of skill in the art will recognize other applications that may be contemplated which are also capable of replacing logic blocks 107 in FIG. 1.

Referring again to FIG. 2, a multi-channel frequency divider 200 implemented as logic blocks 107 is described. The multi-channel frequency divider 200 is implemented having synchronous operation, low power, and high frequency response as primary performance metrics. When implemented as logic blocks 107 within the architecture of FIG. 1, frequency divider circuit 200 does not contribute to phase noise. The circuit components located in regions of the chip containing phase noise contributors (e.g. clock distribution circuit 115, shown in FIG. 1) are optimized for low phase noise. For example, components associated with phase noise contributors are designed for high power density and may include external bypass and optimized bias cells to reduce additional phase noise by minimizing 1/f and thermal noise contribution.

Regions of the chip (e.g. logic blocks 107) that do not contribute to phase noise in the clock signal may be implemented in components that are optimized for miniaturization, lower power, and/or high-speed. The multi-channel frequency divider of FIG. 2 achieves frequency divisions ranging from integer division factors of 1-20 and may accept input frequencies in the GigaHertz (GHz) range. Furthermore, the multi-channel frequency divider may be updated to obtain non-integer fractional division of an input signal. The fractional division factors may be achieved without the need for mixing stages used in typical synthesizer architectures. When implemented in a silicon germanium (SiGe) radio frequency integrated circuit (RFIC) phase noise may be measured at a level of performance which meets or exceeds the levels of regenerative frequency division. For example, an embodiment of a frequency divider for providing a "divide by 10" state may be implemented to produce a phase noise floor that is less than about −170 dBc/Hz.

The logic blocks 107 defining the multi-channel frequency divider are implemented as series counters in high-speed common mode logic (CML). A plurality of D flip flop circuits $201_1$, $201_2$, $201_3$, through $201_n$ are arranged in series. Flip flop circuit $201_1$ receives a clock signal from buffer 109 in the clock distribution path (104, shown in FIG. 1.) The QB output of flip flop circuit $201_1$ is provided as a first input to NOR logic gate 203. A second input to NOR logic gate 203 is coupled to switch 205 which may be used to selectively introduce NOR logic gate 203 in and out of the logic block 107 to output 209. When NOR logic gate 203 is placed into the logic block via switch 205, the frequency divider 200 produces an odd integer division of the input clock signal 202. When the NOR logic gate 203 is bypassed and removed from the logic block via switch 205, the frequency divider 200 will produce an even integer division of the input clock signal 202.

The input clock signal 202 is applied simultaneously to the v input of each flip flop circuit (denoted generally as 201). The output of the NOR logic gate 203 is applied to the D input of flip flop $201_2$. The Q output 211 of flip flop circuit $201_2$ appears at node 213 and is applied to the D input 212 of the next flip flop circuit $201_3$ in the series. Flip flop circuit $201_3$ provides its Q output 215 to node 218 and as input to the D input 216 of the next flip flop circuit in the series. Each flip flop circuit $201_1$-$201_n$ provides its Q output to an output node selectively connected to switch 207. The final flip flop circuit $201_n$ in the series receives its D input from the prior flip flop circuit in the series. Flip flop circuit $201_n$ provides its Q output to node 221.

Switch 207 may be configured to provide an output 209 via nodes 213, 218, 221, or other nodes (not shown) connected to the Q output of flip flop circuits $201_4$-$201_{n-1}$ (not shown in FIG. 2) based on the selected position of switch 207. The particular node (213, 218, 221) selected determines which flip flop circuits 201 are represented in the output 209. By selecting different flip flop circuit outputs, the division factor of the multi-channel frequency divider may be selected to provide a desired or target frequency division factor.

Figure 3:
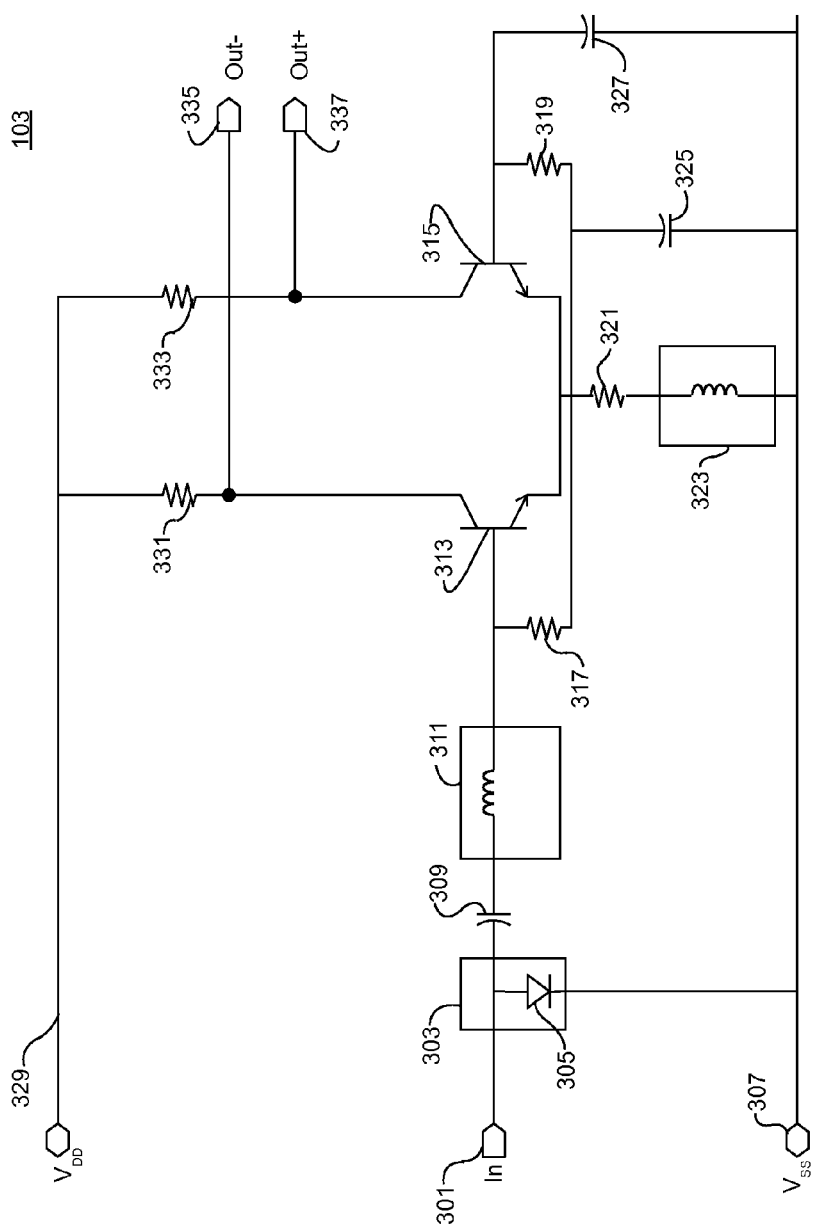
FIG. 3 is a schematic diagram of a clock input buffer circuit according to an embodiment of the disclosure.

FIG. 3 is a schematic diagram of the front-end amplifier 103 for a low phase noise clock distribution circuit such as that shown in FIG. 1 according to an embodiment of the disclosure. The front-end amplifier 103 receives a single ended clock signal 301 to the integrated circuit and converts it to a differential clock signal at outputs 335 and 337 providing robust on-chip isolation performance. The differential output signal 335, 337 is carried all the way to the output of the integrated circuit via output signal 113 of output latch 105. An active balun is employed as the first stage in the front-end, where the design is optimized such that the NPN devices are sized and biased to reduce the transistor noise contributions. According to an embodiment, four separate emitters may be provided to act as a divider/buffer at the output of the active balun, thus enabling the front end amplifier 103 to have four separate and independent outputs. The FET current mirrors used for biasing in the circuit are externally bypassed with a large capacitor, (e.g. about 10 uF) with extremely low equivalent series resistance (ESR) in order to reduce the impact of 1/f noise contribution to the design.

Referring still to FIG. 3, the single ended clock signal 301 is received at limiter 303 which is connected to $V_{SS}$ 307 through diode 305. Limiter 303 allows for improved phase noise performance over a larger operating signal range by preventing the saturation of input transistors 313 and 315. The clock signal 301 is also connected to MIM capacitor 309. MIM capacitor 309 is connected to input matching circuit 311 which is connected to the base of transistor 313. Input transistors 313 and 315 are selectively sized to further reduce phase noise. The emitter of transistor 313 is commonly connected to transistor 315. The base of transistor 315 is connected to $V_{SS}$ 307 via MIM capacitor 327 which maintains bias at transistor 315. The base of transistor 313 is further connected through resistor 317 to resistor 321. The base of transistor 315 is also connected to resistor 321 through resistor 319. Resistor 321 is connected in series with inductor 323 to $V_{SS}$ 307. Resistor 321 and inductor 323 provide common mode rejection to the common mode signal in output 335, 337. Capacitor 325 is connected in parallel with resistor 321 and inductor 323 between resistors 317 and 319 and $V_{SS}$ 307 to provide bias filtering. Capacitor 325 is selected to be a large capacitor with low equivalent series resistance (ESR), for example, capacitor 325 may be selected to have a capacitance value of about 10 μF. Capacitor 325 is connected in parallel with the current mirrors used to bias transistors 313, 315 which reduce the impact of 1/f noise contribution to the differential output signal 335, 337 of the circuit. $V_{DD}$ 329 is connected to the collector of transistor 313 through resistor 331 and to the collector of transistor 315 through resistor 333 which act as load resistors. Negative output signal 335 is connected to a node between load resistor 331 and the collector of transistor 313. Positive output signal 337 is connected to a node between load resistor 333 and transistor 315.

Figure 4A:
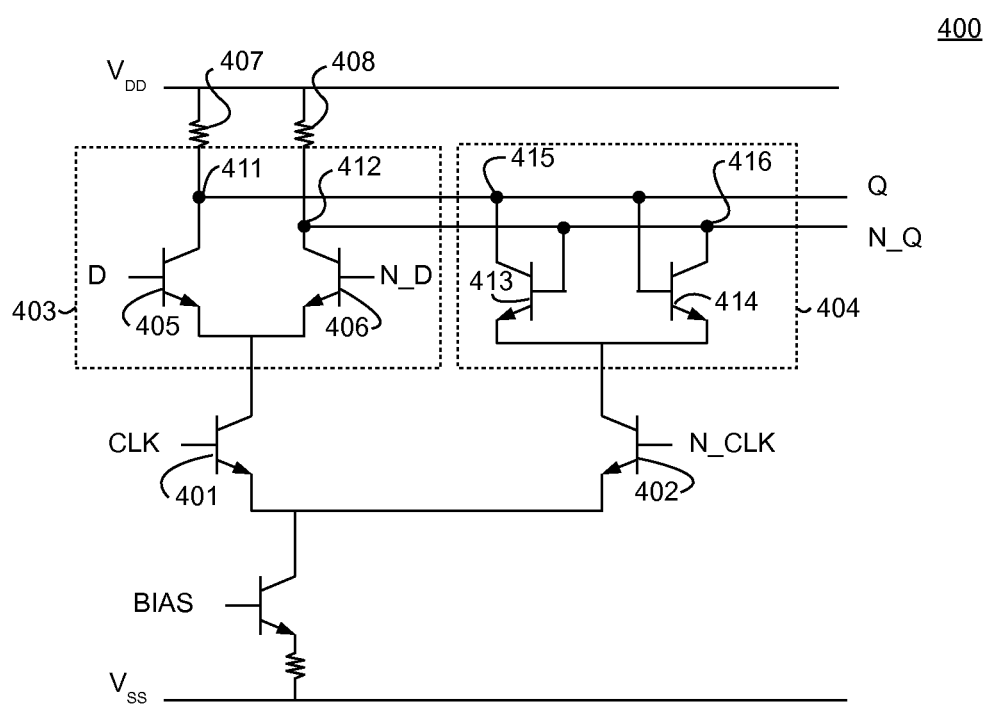
FIGS. 4A and 4B are schematic diagrams of conventional output latch circuits.
Figure 4B:
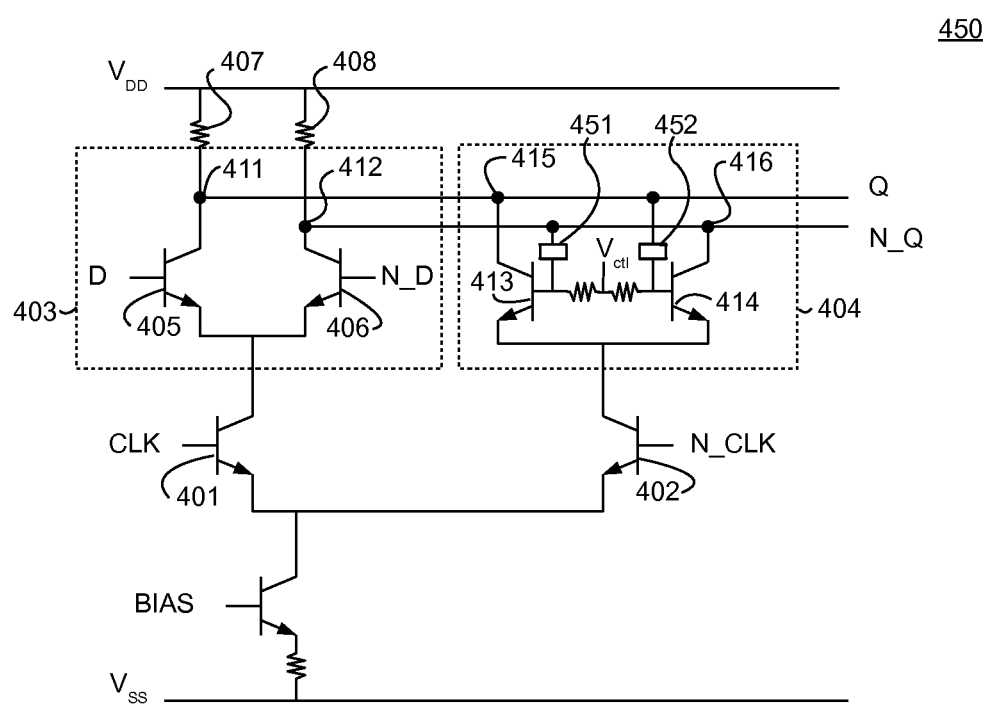

The output latch 105 shown in FIG. 1 provides low phase noise operation while providing improvements over previously designed latch circuits. Examples of such conventional latch circuits are described with reference to FIGS. 4A and 4B. FIG. 4A and FIG. 4B are schematic diagrams of conventional output latch designs implemented using a D flip flop circuit. Referring to the D output latch 400 of FIG. 4A, a differential clock input (CLK, N_CLK) is applied to the base electrodes of clock input transistor pair 401, 402.

Responsive to the state of the clock signal (CLK, N_CLK), the clock input transistor pair 401, 402 steers current to either sense cell 403 or storage cell 404. Sense cell 403 includes input transistor pair 405, 406 which receive a differential D input at their respective base electrodes. When the clock signal CLK is high, current is directed to the D input transistor pair 405, 406. Depending on the state of the voltage across input (D, N_D), transistor pair 405, 406 steers current to $V_{DD}$ via one of paths 407, 408 through resistors 409, 410, respectively. Current flowing through resistor 409 causes a voltage level at node 411. Current flowing through resistor 410 causes a voltage level at node 412. The voltage levels at nodes 411 and 412 also provide the differential output (Q, N_Q).

When the CLK signal changes, N_CLK goes high and current is steered to storage cell 404. The current is applied to the emitters of storage input transistor pair 413, 414. The voltage levels at nodes 411, 412 provide bias to the base electrodes of storage input transistor pair 413, 414. Current is steered through storage cell 404 based on the present voltage state of output nodes 411, 412 and is steered back to the output at nodes 415, 416 to the same resistor (409, 410) that the sense cell 403 directed the current based on the state of the D input. The D flip flop output latch circuit 400 shown in FIG. 4A suffers from the limitation that the bias levels of the storage input transistor pair 413, 414 is set directly by the output nodes 411, 412. This limits the output swing that can be realized because the output value must be limited to a state where it correctly drives or biases the transistor pair in the storage cell 404.

The D-latch 450 of FIG. 4B attempts to address the output swing limitation of the D flip flop output latch circuit 400 shown in FIG. 4A by adding DC block capacitors 451, 452 to the feedback path. This allows for large output swings which are desirable in certain applications. However, capacitors 451, 452 act as high pass filters, thereby limiting the effective useable frequency range. Based on the size of capacitors 451, 452 D-latch 450 will have a limited hold time. For a typical integrated circuit, the D-latch 450 shown in FIG. 4B would be limited to operating at frequencies above a few hundred Megahertz (MHz) due to practical limitations on capacitor size. The output latch 105 described in FIG. 1 and shown in greater detail in FIG. 5 addresses these limitations of output swing and operating frequency exhibited by conventional D-latch circuits (e.g. 400, 450 shown in FIGS. 4A and 4B).

Figure 5:
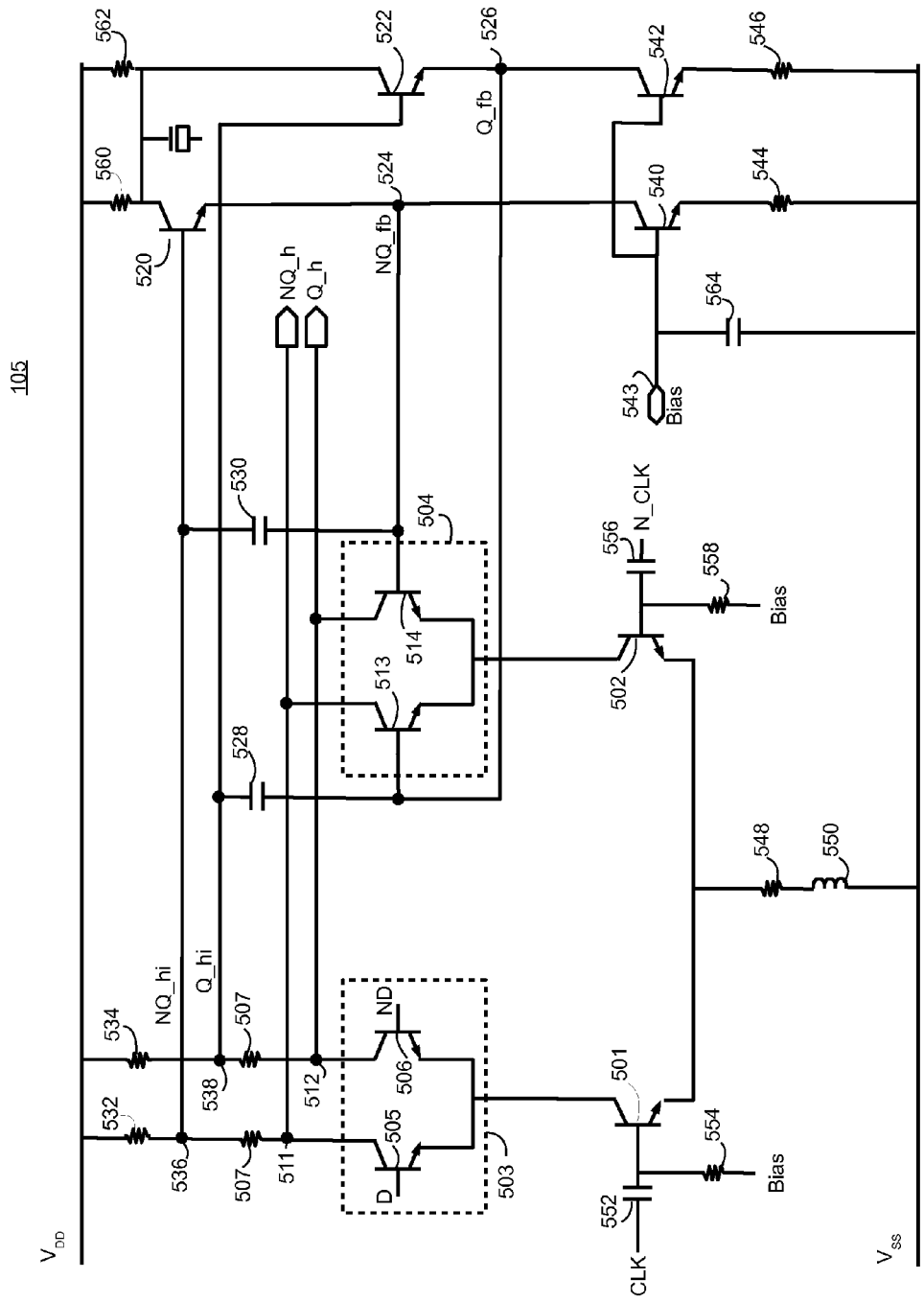
FIG. 5 is a schematic diagram of a clock output latch according to an embodiment of the disclosure.

FIG. 5 is a schematic diagram of output latch circuit 105 for a low phase noise integrated circuit according to an embodiment of the disclosure. A differential input clock signal (CLK, N_CLK) received from the outputs of front end amplifier 103 (shown in FIG. 3 as differential outputs 335, 337) is input to the base of clock input transistors 501 and 502. Capacitor 552 acts as a DC block on the input CLK and a bias voltage is provided through resistor 554 to set the operating current of transistor 501. Capacitor 556 acts as a DC block on the input N_CLK and a bias voltage is provided through resistor 558 to set the operating current of transistor 502. The emitters of clock input transistors 501, 502 are commonly connected to $V_{SS}$ by series connected resistor 548 and inductor 550 which provide common mode rejection of common mode signal components. Differential D inputs (D, ND) are input to respective bases of D input transistor pair 505 and 506 which define sense cell 503. Data input D, is the output from the logic blocks shown in FIG. 2 as output 209. Data input ND is the differential input corresponding to the digital output 209 of the logic blocks. The emitters of transistors 505 and 506 are commonly connected to clock input transistor 501. The collector of transistor 505 is connected to $V_{DD}$ through series connected resistors 507 and 532. The collector of transistor 506 is connected to $V_{DD}$ through series connected resistors 508 and 534.

Collector of clock input transistor 502 is commonly connected to the emitters of transistor 513 and transistor 514 which define storage cell 504. The collector of transistor 513 is connected to output NQ_h 511 of differential output pair (Q_h, NQ_h). Output NQ_h 511 is also applied to the base of transistor 520. The collector of transistor 513 is connected to output Q_h 512 of differential output pair (Q_h, NQ_h). Output Q_h 512 is also applied to the base electrode of transistor 522. Transistors 520 and 522 are configured as an emitter follower which provides feedback (524, 526) to the base electrodes of transistors 513, 514 in the storage cell 504.

The base of transistor 540 and the base of transistor 542 are commonly connected to Bias 543. Bias 543 is connected to $V_{SS}$ via capacitor 564. Resistor 544 is connected between $V_{DD}$ and the collector of transistor 540. The emitter of transistor 520 is connected to the collector of transistor 540. The emitter of transistor 542 is connected to $V_{SS}$ through resistor 546. Resistor 562 is connected between $V_{DD}$ and the collector of transistor 522. The emitter of transistor 522 is connected to the collector of transistor 542.

Output latch 105 improves on the latches of FIGS. 4A and 4B at least by adding feedback transistors 520, 522 configured as emitter followers to provide feedback to storage cell 504. Transistor 520 provides a feedback loop (NQ_fb) to the base of transistor 514 at node 524. Transistor 522 provides a feedback loop (Q_fb) to base of transistor Q_h 512 at node 526. The feedback swing can be kept small relative to large output swings by splitting the output resistors. It will be noted that feedback capacitors 528, 530 are still included in the design similarly to the latch illustrated in FIG. 4B. However, in output latch circuit 105, the capacitors 528, 530 are much smaller and only serve to aid with the operation of storage cell 504 in the presence of high bias and voltage swings in the main circuit of the latch while feedback transistors 520 and 522 are biased comparatively lower. It should be noted that in SiGe HBT's (which may be used in the implementation of output latch 105), these devices can be used reliably at voltage levels well past their specified collector to emitter breakdown voltage. In cases where the bias point is set by a low DC impedance on the base, the bias point is set using the low impedance output of the emitter follower feedback transistors 520, 522. Using this implementation, the modified D flip flop output latch circuit 105 is capable of very high output swings (even beyond the capability of the circuit of FIG. 4B) and can operate from DC to very high frequencies similar to those achievable by the latch circuit shown in FIG. 4A. Output latch 105 simultaneously allows for superior output power and frequency range compared to other known D-latch topologies.

As discussed hereinabove, logic blocks 107 may be implemented as a frequency divider circuit. In low noise frequency synthesis, it is often necessary to create frequencies with a fractional relationship to a low noise source frequency. Present methods operate by the use of low noise integer frequency division, typically regenerative frequency dividers, and then employ a mixing stage or series of mixing stages to create the desired frequency. SiGe RFICs are beginning to improve in phase noise performance based on single chip solutions. However, these chips only perform integer frequency divisions. A frequency divider such as the frequency divider (200, shown in FIG. 2) may be extended to provide fractional frequency division through the use of exclusive OR (XOR) logic functions. For example, if a divide by 4 (/4) is XOR'd with the input clock signal, a frequency divide factor of ¾ of the original clock signal is obtained. This may be considered a digital mixer or a controlled comb generator. This technique may be used to create other fractional frequency divisions as well.

Figure 6A:
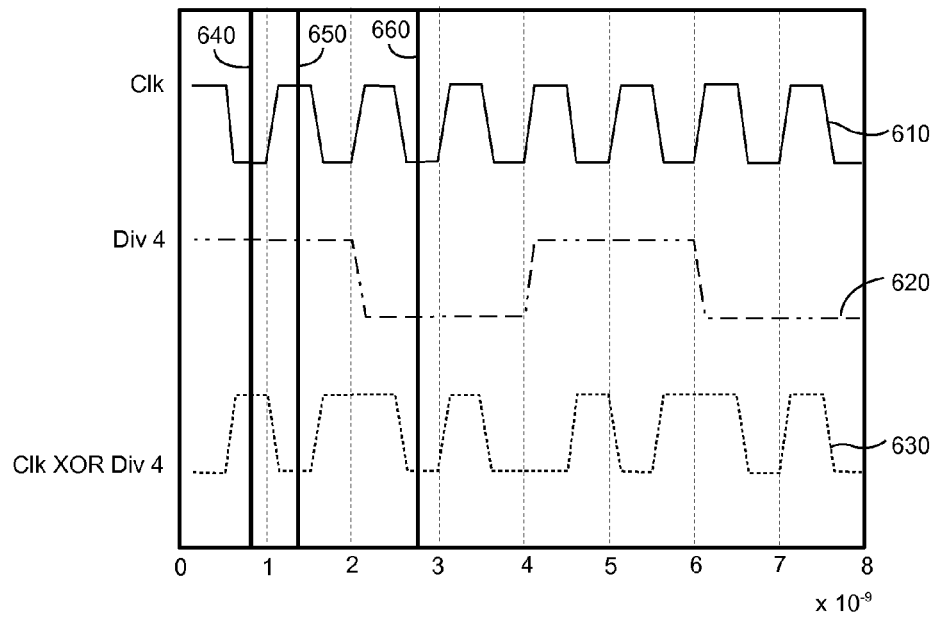
FIG. 6A is a graph of a clock signal, frequency divided signal, and logic operation to output a frequency that is a non integer fraction of the clock signal according to an embodiment of the disclosure.

FIG. 6A is a chart illustrating the XOR operation of a "divide by 4" frequency divider and the input clock signal. The input clock signal is shown as line 610. The output of the divide by 4 frequency divider is shown as line 620. As may be seen in FIG. 6A, for every 4 pulses of the clock signal 610, the divide by four output signal 620 shows one pulse. The result of performing an XOR logic operation is shown as line 630. Line 630 contains 3 pulses for each 4 pulses occurring in the original clock signal 610. Therefore, the resultant fractional frequency is ¾. The XOR logic operation outputs a high signal when one of either the original clock signal 610 or the divide by four signal 620 is high, but not both. For example, at line 640, the divide by four signal 620 is high, while the original clock signal 610 is low, therefore the resulting XOR operation is high on line 630. At line 650, both the original clock signal 610 and the divide by four signal 620 are high, therefore the resulting XOR operation is low. At line 560, the original clock signal 610 is low and the divide by four signal 620 is also low, therefore the output of the XOR operation 630 is also low. The resulting frequency of the XOR operation output is ¾ of the original clock frequency.

Figure 6B:
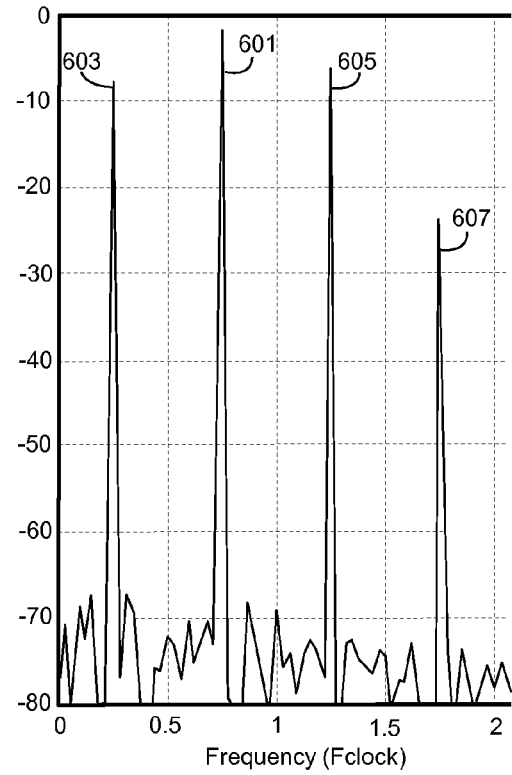
FIG. 6B is a graph of the frequency distribution of a frequency divider implementing the logic shown in FIG. 5.

FIG. 6B is a graph of frequencies generated by the ¾ frequency divider whose output is shown in FIG. 6A. As may be seen a comb of frequencies is created. The ¾ Fclock frequency is emphasized having the highest amplitude 601. Other frequencies occur at ½ Fclock intervals as shown by frequencies spikes at 603, 605 and 607. These extra frequencies are spaced at even ½ Fclock intervals and therefore can be easily filtered out of the final output. The frequency divider may be used in applications such as local oscillator (LO) generation, synthesizer simplification, and fractional N phase locked loops using integer N phase detectors which will have better spurious performance.

A SiGe multi-channel frequency divider architecture has been disclosed herein with low phase noise as the primary performance metric. The architecture is based on segregating the phase noise contributors to the clock distribution and the final latch implementation. Implementation of the clock distribution stage is optimized for phase noise; other areas of the chip that do not contribute to phase noise are optimized for miniaturization, low power, and high speed. With this architecture, frequency divisions from 1-20 are achievable, with frequency inputs into the GHz range. In addition the architecture allows upgrades to implement fractional frequency division that can be used to eliminate mixing stages currently used in synthesizer architectures. Phase Noise has been simulated and measured at the level of performance similar to regenerative frequency division (e.g. less than about −170 dBc/Hz). This is approximately 10 dB better than currently available SiGe frequency dividers.

Figure 7:
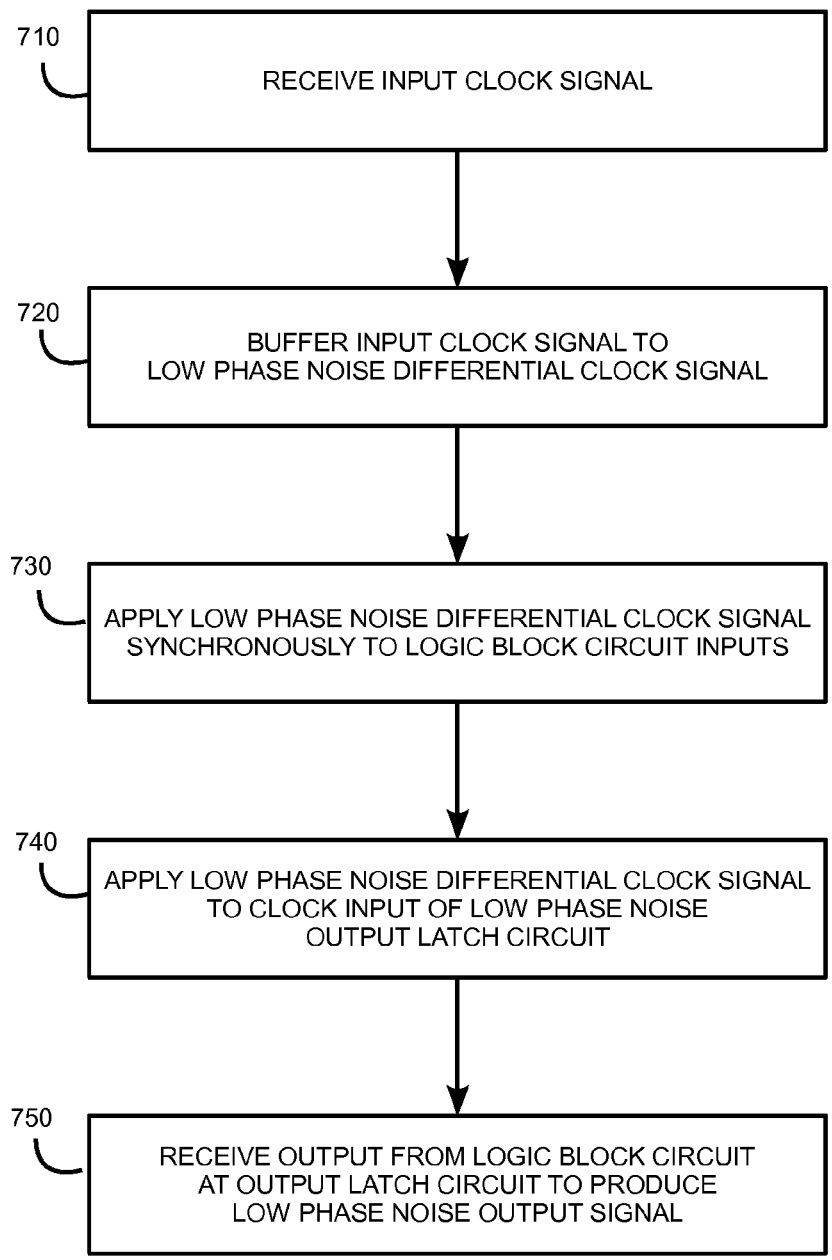
FIG. 7 is a process flow diagram of a method of generating a low phase noise output signal in an integrated circuit according to an embodiment of the disclosure.

FIG. 7 is a process flow diagram 700 for generating a low phase noise output signal from an integrated circuit according to an embodiment of the disclosure. At block 710, the circuit receives an input clock signal at an input clock buffer. The input clock buffer circuit converts the input clock signal to a low phase noise differential input clock signal 720. The low phase noise differential clock signal is synchronously applied to logic block circuits 730. The low phase noise differential clock signal is applied the differential clock input of a low noise output latch circuit 740. The low noise output latch circuit receives the output signal of logic block circuitry at the D input of the out put latch circuit and produces a low phase noise output signal representative of the logic block circuit output 750.

It is to be understood that the figures and descriptions of the present invention have been simplified to illustrate elements that are relevant for a clear understanding of the present invention, while eliminating, for purposes of clarity, many other elements found in frequency translation devices, including regenerative frequency dividers. However, because such elements are well known in the art, and because they do not facilitate a better understanding of the present invention, a discussion of such elements is not provided herein. The disclosure herein is directed to all such variations and modifications known to those skilled in the art.

While the foregoing invention has been described with reference to the above-described embodiment, various additional modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:
1. An integrated circuit comprising:
a clock distribution circuit operable in a low phase noise mode of operation configured to generate a low phase noise differential clock signal and including at its input an input buffer circuit, and an output latch circuit coupled to the output of the input buffer;
a logic block circuit which does not operate in a low phase noise mode of operation configured to receive the differential clock signal from said clock distribution circuit for processing logic operations within said logic block circuit and generating output data therefrom to a data input of said output latch circuit of said clock distribution circuit, said output latch circuit producing an output based on the output data of the logic block circuit according to the low phase noise differential clock signal that clocks said output latch circuit of said clock distribution circuit.

2. An integrated circuit comprising:
a clock distribution circuit configured to generate a low phase noise differential clock signal and including at its input an input buffer circuit, and an output latch circuit coupled to the output of the input buffer circuit;
a logic block circuit segregated from said clock distribution circuit and configured to receive the differential clock signal from said clock distribution circuit for processing logic operations within said logic block circuit and generating output data therefrom for output via said output latch circuit of said clock distribution circuit; wherein said logic block circuit is configured to have lower phase noise performance than said clock distribution circuit, wherein said output latch circuit is configured to re-clock the output data from said logic block circuit to generate a low phase noise output signal.

3. The integrated circuit of claim 1, wherein said input buffer circuit and said output latch circuit comprise circuitry components configured to minimize contributions to phase noise.

4. The integrated circuit of claim 1, wherein said input buffer circuit comprises:
an input configured to receive the singular input clock signal;
a pair of input transistors;
a limiter connected between said input and bases of said pair of input transistors;
wherein said pair of input transistors includes a first transistor having its base connected to said limiter, and a second transistor having its base connected to said limiter and to a capacitor placed in series between the base of said second transistor and a $V_{SS}$ reference voltage, wherein a differential output clock signal is generated from the collectors of said pair of input transistors.

5. The integrated circuit of claim 4, wherein said input buffer circuit further comprises a resistor and inductor connected in series between the emitters of said first and second transistor of said pair of input transistors and said $V_{SS}$ reference voltage for providing common mode rejection of common mode signal components.

6. The integrated circuit of claim 4, wherein said first and second input transistors are selectively sized to minimize contributors to phase noise.

7. The integrated circuit of claim 4, wherein said input buffer circuit further comprises a capacitor connected in series between the bases of said first and second transistors of said input transistor pair and said $V_{SS}$ reference voltage to provide a bias filter.

8. The integrated circuit of claim 1, wherein said output latch circuit comprises:
a first pair of clock input transistors configured to receive a differential input clock signal at the bases of said first pair of clock input transistors;
a sense cell configured to receive a differential D input and to produce a differential output signal;
a storage cell configured to hold a value of said differential output signal when the differential input clock signal changes;
a pair of emitter follower transistors configured to output a feedback signal to bases of a pair of storage transistors of said storage cell.

9. The integrated circuit of claim 8, wherein said sense cell comprises a pair of D input transistors, said pair of D input transistors configured to receive said differential D input at their respective bases, the emitters of said pair of D input transistors commonly connected to the collector of a first transistor of said first pair of clock input transistors, and wherein the collector of each transistor of said D input transistor pair is connected to a $V_{DD}$ reference voltage via a pair of resistors connected in series to produce a first voltage level at a first node defined between said collector and a first resistor of said pair of resistors, and a second voltage level at a second node defined between said first resistor and a second resistor of said pair of resistors.

10. The integrated circuit of claim 9, wherein said first node of said D input transistor pair is connected to the collectors of said pair of storage transistors, and said second node of said D input transistor pair is connected to the bases of said feedback transistor pair.

11. The integrated circuit of claim 1, wherein said clock distribution circuit is configured with components selected to minimize contributors to phase noise, and wherein said logic block circuit is configured with components selected for high speed, miniaturization, or low power without regard for phase noise.

12. The integrated circuit of claim 11, wherein said logic block circuit is coupled to said clock distribution network by at least one input clock buffer.

13. The integrated circuit of claim 12, wherein said at least one input clock buffer comprises a plurality of input clock buffers, each input clock buffer of said plurality of input clock buffers configured to provide a synchronous clock signal with respect to each other input clock buffer of said plurality of input clock buffers.

14. The integrated circuit of claim 8, wherein said logic block circuit is implemented as a frequency divider circuit, said integrated circuit configured to produce an output signal exhibiting low phase noise.

15. The integrated circuit of claim 14, wherein an output of said frequency divider circuit is applied as said differential D input to said sense cell of said output latch circuit.

16. A method of generating an output signal having low phase noise in an integrated circuit, the method comprising the steps of:
receiving an input clock signal to a front end amplifier;
buffering said input clock signal to a differential input clock signal;
applying said differential input clock signal to an output latch circuit, said output latch circuit being configured to produce an output signal having a high output swing and to provide operation across a wide operating frequency band;
providing said differential input clock signal to a logical block circuit that processes logic operations and generates output data therefrom;
applying the generated output data from the logical block circuit to an input of said output latch circuit that is clocked according to the differential input clock signal to output a low phase noise output signal from said output latch circuit.

17. The method of claim 16, wherein applying said logic output signal to an input of said output latch circuit further comprises the steps of:
in said output latch circuit, receiving said input to the bases of a pair of D input transistors;
producing a voltage output level from the collector of each transistor of said D input transistor pair, based on a state of said differential input clock signal;

applying the voltage output level from the collectors of the input transistor pair to the bases of a pair of storage transistors configured to maintain said voltage output level when said differential clock input signal changes; and producing a second voltage output level from the collector of each transistor of said D input transistor pair and applying said second voltage level to the bases of a pair of emitter follower feedback transistors, each transistor of said pair of emitter follower feedback transistors configured to provide a feedback signal to the base of a corresponding storage transistor of said pair of storage transistors.

18. The method of claim 16, wherein buffering said input clock signal to a differential clock input signal comprises providing said input clock signal to a pair of low phase noise input transistors via a limiter circuit, said limiter circuit configured to prevent transistors of the low phase noise input transistor pair from operating in a saturated state.

19. The method of claim 18, wherein buffering said input clock signal to a differential clock input signal further comprises providing a capacitor connected between the bases of transistors of said pair of low phase noise input transistors and a $V_{SS}$ reference voltage to provide a bias filter.

20. The method of claim 16, further comprising:
processing said logic output signal in said logical block circuit for input to said output latch circuit.

* * * * *